(12) United States Patent
Kim

(10) Patent No.: US 8,928,144 B2
(45) Date of Patent: Jan. 6, 2015

(54) 3D NON-VOLATILE MEMORY DEVICE, MEMORY SYSTEM INCLUDING THE SAME, AND METHOD OF MANUFACTURING THE SAME

(75) Inventor: Suk Goo Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 7 days.

(21) Appl. No.: 13/599,956

(22) Filed: Aug. 30, 2012

(65) Prior Publication Data

US 2013/0155771 A1 Jun. 20, 2013

(30) Foreign Application Priority Data

Dec. 20, 2011 (KR) .......................... 10-2011-0138205

(51) Int. Cl.
*H01L 23/48* (2006.01)

(52) U.S. Cl.
USPC ............. 257/758; 257/67; 257/314; 257/686; 257/700

(58) Field of Classification Search
USPC ............................ 257/67, 686, 700, 758, 314
See application file for complete search history.

(56) References Cited

U.S. PATENT DOCUMENTS

2011/0049646 A1* 3/2011 Lim et al. ...................... 257/410
2012/0058629 A1* 3/2012 You et al. ....................... 438/479

FOREIGN PATENT DOCUMENTS

KR 1020110034946 4/2011

* cited by examiner

*Primary Examiner* — Tan N Tran
(74) *Attorney, Agent, or Firm* — IP & T Group LLP

(57) ABSTRACT

A three-dimensional 3D nonvolatile memory device includes vertical channel layers protruding from a substrate; interlayer insulating layers and conductive layer patterns alternately deposited along the vertical channel layers; a barrier metal pattern surrounding each of the conductive layer patterns; a charge blocking layer interposed between the vertical channel layers and the barrier metal patterns; and a diffusion barrier layer interposed between the barrier metal patterns and the charge blocking layer.

7 Claims, 9 Drawing Sheets

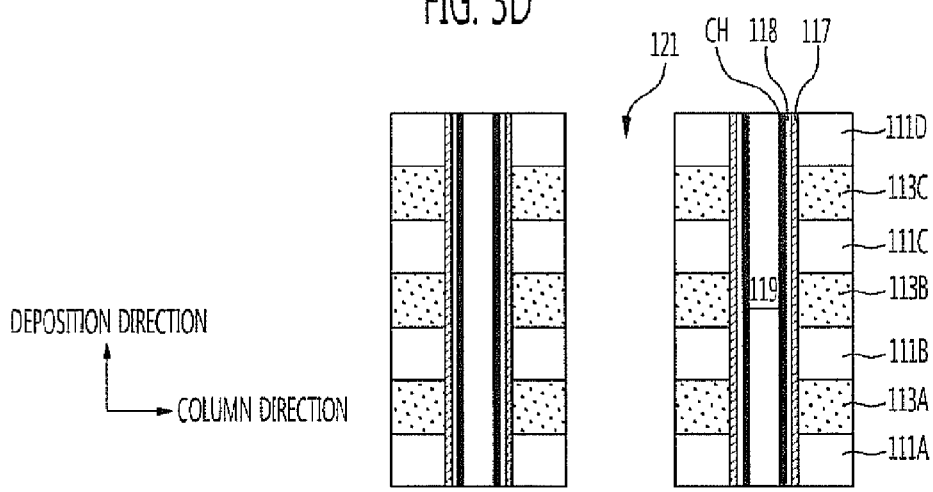
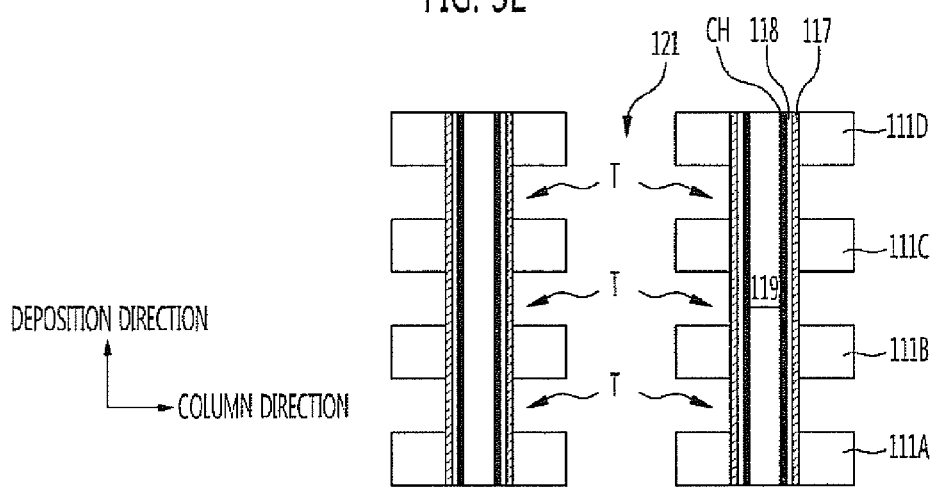
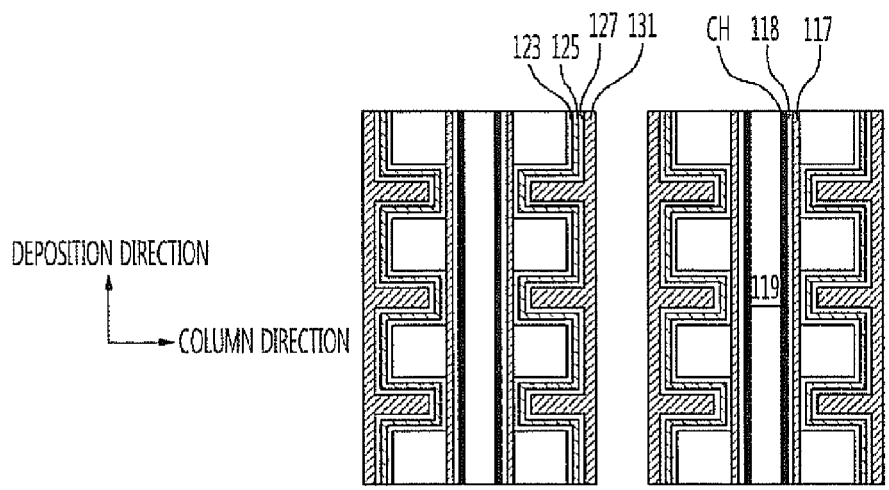

3D NON-VOLATILE MEMORY DEVICE, MEMORY SYSTEM INCLUDING THE SAME, AND METHOD OF MANUFACTURING THE SAME

CROSS-REFERENCE TO RELATED APPLICATION

This application is based on and claims priority from Korean Patent Application No. 10-2011-0138205, filed on Dec. 20, 2011, with the Korean Intellectual Property Office, the disclosure of which is incorporated herein in its entirety by reference.

BACKGROUND

The present invention relates to a semiconductor device and a method of manufacturing the semiconductor device, and more particularly to a 3D non-volatile memory device, a memory system including the 3D non-volatile memory device, and a method of manufacturing the 3D non-volatile memory device.

Technology for a memory device has been developed in a direction capable of improving an integration degree. Generally, in order to improve the density of the memory device, methods of reducing sizes of two-dimensionally arranged memory cells have been developed. According to the reduction of the size of the memory cell of a two-dimensional (2D) memory device, interference and disturb are increased. As a result, it is difficult to perform a Multi Level Cell (MLC) operation. In order to overcome a limitation of the 2D memory device, a memory device having a three-dimensional (3D) structure for improving a density by three-dimensionally arranging memory cells on a substrate has been suggested. The memory device having the 3D structure may efficiently utilize an area of the substrate, so that the density may be improved compared to a case in which the memory cells are two-dimensionally arranged.

The memory cells of the 3D memory device include conductive layers and interlayer insulating layers that are alternately deposited, and vertical channel layers passing through the conductive layers and the interlayer insulating layers. In order to improve reliability of the 3D memory device, various techniques have been recently suggested.

SUMMARY OF THE INVENTION

The present invention has been made in an effort to provide a 3D non-volatile memory device including vertical channel layers passing through interlayer insulating layers and conductive layers that are alternately deposited, a memory system including the 3D non-volatile memory device, and a method of manufacturing the 3D non-volatile memory device.

An exemplary embodiment of the present invention provides a 3-Dimensional (3D) non-volatile memory device including: vertical channel layers protruding from a substrate; interlayer insulating layers and conductive layer patterns alternately deposited along the vertical channel layers; a barrier metal pattern surrounding each of the conductive layer patterns; a charge blocking layer interposed between the vertical channel layers and the barrier metal patterns; and a diffusion barrier layer interposed between the barrier metal patterns and the charge blocking layer.

Another exemplary embodiment of the present invention provides a memory system including: a 3D non-volatile memory device including vertical channel layers protruding from a substrate, interlayer insulating layers and conductive layer patterns alternately deposited along the vertical channel layers, a barrier metal pattern surrounding each of the conductive layer patterns, a charge blocking layer interposed between the vertical channel layers and the barrier metal patterns, and a diffusion barrier layer interposed between the barrier metal patterns and the charge blocking layer; and a memory controller configured to control the 3D non-volatile memory device.

Another exemplary embodiment of the present invention provides a method of manufacturing a 3D non-volatile memory device, including: alternately depositing first material layers and second material layers on a substrate; forming vertical channel layers passing through the first material layers and the second material layers; forming a slit between the vertical channel layers by etching the first material layers and the second material layers; forming trenches by removing the second material layers exposed through the slit; sequentially forming a charge blocking layer, a diffusion barrier layer, and a barrier metal layer along a surface of the slit and along surfaces of the trenches; forming a conductive layer filling the trenches on the barrier metal layer; and etching the conductive layer, the barrier metal layer, and the diffusion barrier layer from the surface of the slit between each of the trenches, so that the conductive layer, the barrier metal layer, and the diffusion barrier layer formed in one of the trenches is separated from the conductive layer, the barrier metal layer, and the diffusion barrier layer formed in another one of the trenches.

BRIEF DESCRIPTION OF THE DRAWINGS

FIGS. 3A to 3G are cross-sectional views illustrating a method of manufacturing a 3D non-volatile memory device according to an exemplary embodiment of the present invention.

DESCRIPTION OF SPECIFIC EMBODIMENTS

Hereinafter, an exemplary embodiment of the present invention will be described with reference to the accompanying drawings in detail. However, the present invention is not limited to an embodiment disclosed below and may be implemented in various forms. The embodiment is provided only for illustrative purposes and for full understanding of the scope of the present invention by those skilled in the art, and the scope of the present invention will be understood based on the claims of the present invention.

Figure 1A:
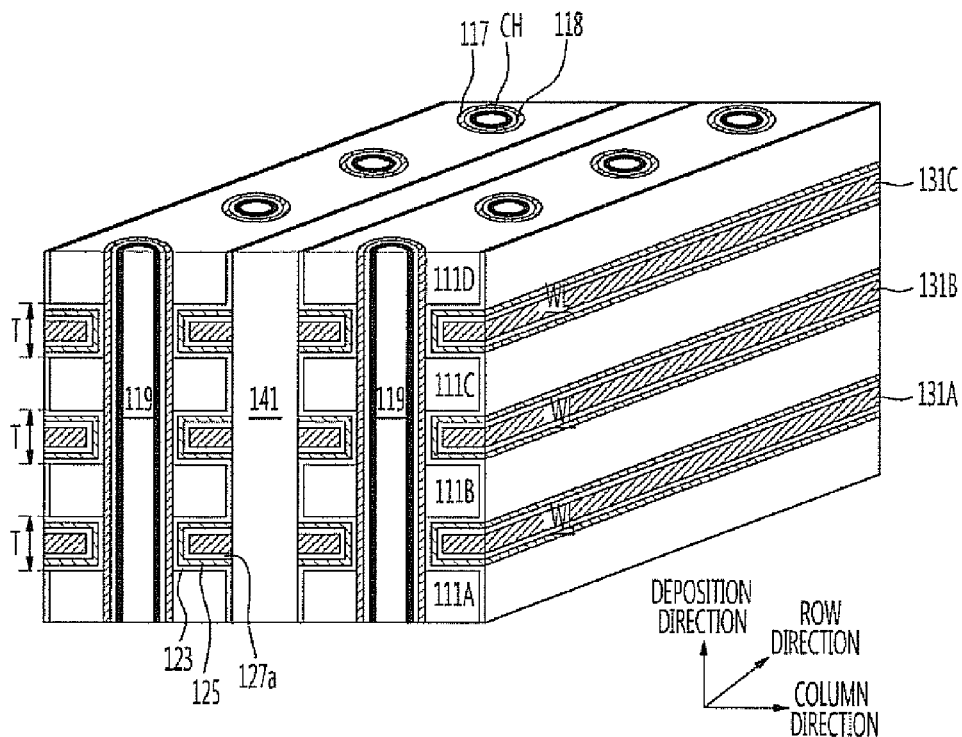
FIGS. 1A to 1C are perspective view illustrating a part of a 3D non-volatile memory device according to exemplary embodiments of the present invention.
Figure 1B:
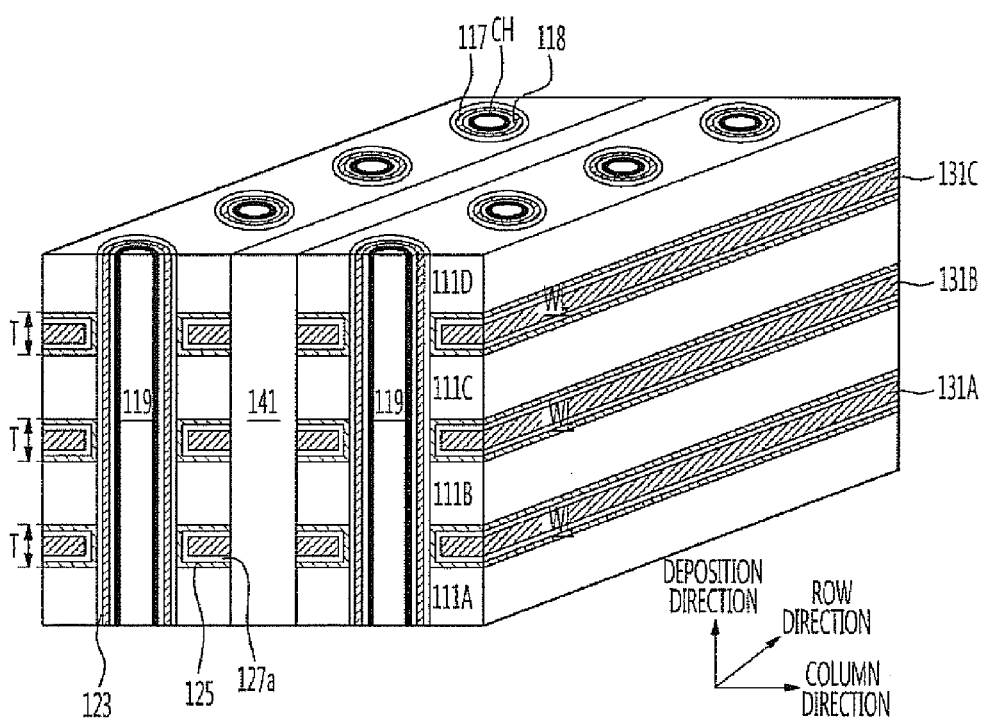
Figure 1C:
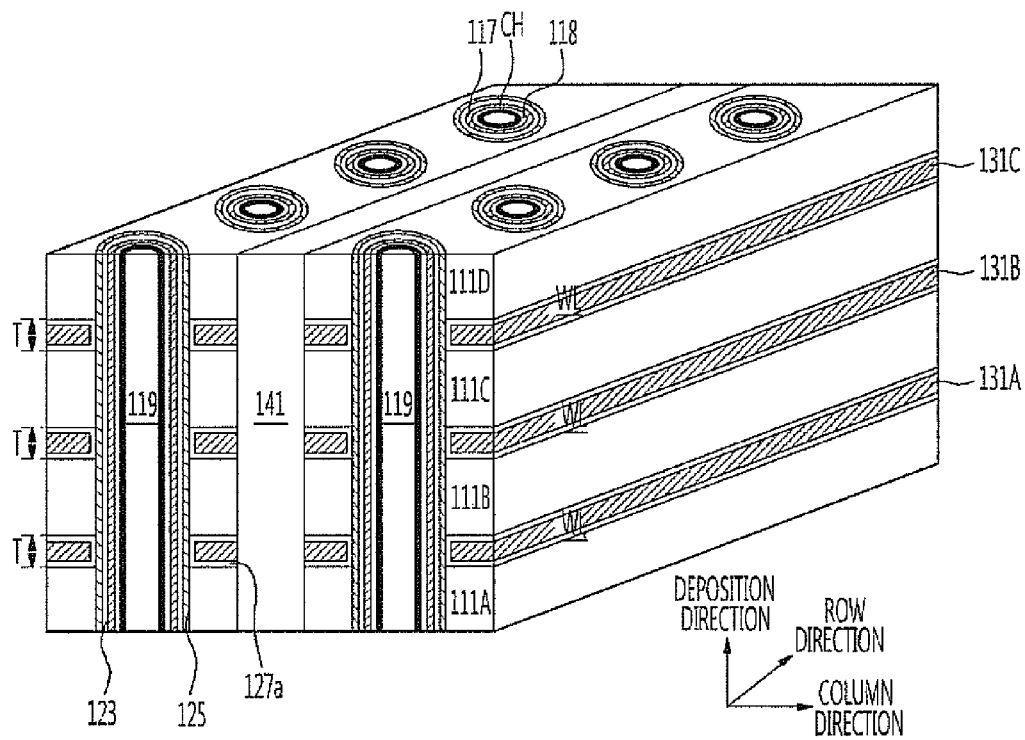

FIGS. 1A to 1C are perspective view illustrating a part of a 3D non-volatile memory device according to exemplary embodiments of the present invention.

Referring to FIGS. 1A to 1C, the 3D non-volatile memory device according to the exemplary embodiments of the present invention includes vertical channel layers CH. The vertical channel layers CH protrude from a substrate (not shown), and are arranged in a matrix form including a plurality of columns and a plurality of rows. Each of the vertical channel layers CH may be formed of a semiconductor material layer shaped like a tube surrounding an insulating layer or formed in a shape of a pillar formed of a semiconductor material layer.

The vertical channel layers CH are surrounded by interlayer insulating layers 111A to 111D and conductive layer patterns 131A to 131C that are alternately stacked. The interlayer insulating layers 111A to 111D and the conductive layer patterns 131A to 131C are penetrated by an insulating layer 141. The insulating layer 141 is formed between the adjacent vertical channel layers CH and may be expanded in one direction.

The conductive layer patterns 131A to 131C are formed within trenches T formed between the interlayer insulating layers 111A to 111D and separated for each trench T. The trench T may be a space defining a region in which a word line WL is to be formed.

The respective conductive layer patterns 131A to 131C are surrounded with barrier metal patterns 127a. The barrier metal patterns 127a are formed within the trenches T, and are separated for each trench T.

The charge blocking layer 123 is interposed between the vertical channel layer CH and the barrier metal pattern 127a, and a diffusion barrier layer 125 is interposed between the barrier metal pattern 127a and the charge blocking layer 123. Further, a charge storing layer 117 is interposed between the charge blocking layer 123 and the vertical channel layer CH, and a tunnel insulating layer 118 is interposed between the charge storing layer 117 and the vertical channel layer CH.

The charge storing layer 117 and the tunnel insulating layer 118 may be formed so as to surround an external wall of the vertical channel layer CH.

The charge blocking layer 123 may be formed along the surface of the trench T to surround the barrier metal pattern 127a as illustrated in FIG. 1A, or may be formed so as to surround the external wall of the vertical channel layer CH as illustrated in FIGS. 1B and 1C.

The diffusion barrier layer 125 may be formed along the surface of the trench T so as to surround the barrier metal pattern 127a as illustrated in FIGS. 1A and 1B. Further, when the diffusion barrier layer 125 is an insulating layer, the diffusion barrier layer 125 may be formed so as to surround an external wall of the vertical channel layer CH as illustrated in FIG. 1C.

Each of the conductive layer patterns 131A to 131C within the trench T and the barrier metal pattern 127a surrounding each of the conductive layer patterns 131A to 131C may be used as a word line WL. A memory cell transistor is defined at a crossing part of the word line WL and the vertical channel layer CH. According to the aforementioned structure, the memory cell transistors according to the exemplary embodiment of the present invention are deposited along the vertical channel layers CH, to be 3-dimensionally arranged.

The respective conductive patterns 131A to 131D may be formed of a poly silicon layer or a material layer having lower resistance and a larger work function than that of a poly silicon layer. For example, the respective conductive patterns 131A to 131D may be formed of tungsten (W). When the respective conductive patterns 131A to 131D are formed of a material layer having a high work function, a back-tunneling of the charge toward the charge storing layer through the charge blocking layer 123 may be reduced. When the back-tunneling is reduced, a retention property of the memory cell is increased.

The barrier metal pattern 127a may be formed of a material interrupting the reaction between the conductive layer patterns 131A to 131D having a high work function and the charge blocking layer 123. Further, the barrier metal pattern 127a may be formed of a material layer having a high work function in order to reduce the back-tunneling. The barrier metal pattern 127a having a high work function may include a group 3 element or a group 5 element. More particularly, the barrier metal pattern 127a may be formed of a doped poly silicon layer on which TiAlN, TaN, or a P-type impurity is doped. When a composition of the group 3 element or the group 5 element is increased within the barrier metal pattern 127a, the work function of the barrier metal pattern 127a may be increased. For example, the work function of the barrier metal pattern 127a may be increased by increasing a content of the group 3 element, such as aluminum (Al), in the barrier metal pattern 127a formed of TiAlN.

The diffusion barrier layer 125 is formed so as to reduce or remove the diffusion of the impurity from the barrier metal pattern 127a to the charge blocking layer 123 by heat. The diffusion barrier layer 125 includes a group 3 element or a group 5 element. Especially, in order to prevent the diffusion of the impurity from the barrier metal pattern 127a, the diffusion barrier layer 125 includes a different type of impurity from that included in the barrier metal pattern 127a. For example, when the barrier metal pattern 127a includes a group 3 element, the diffusion barrier layer 125 includes a group 5 element, and when the barrier metal pattern 127a includes a group 5 element, the diffusion barrier layer 125 includes a group 3 element. As described above, according to the exemplary embodiment of the present invention, different types of impurities are included in the barrier metal pattern 127a and the diffusion barrier layer 125, so that a first impurity (e.g. a group 3 element) from the barrier metal pattern 127a may be offset by a second impurity (e.g. a group 5 element) having a different type from that of the first impurity and included in the diffusion barrier layer 125. Accordingly, the diffusion from the first purity from the barrier metal pattern 127a to the charge blocking layer 123 may be reduced or removed.

Figure 2A:
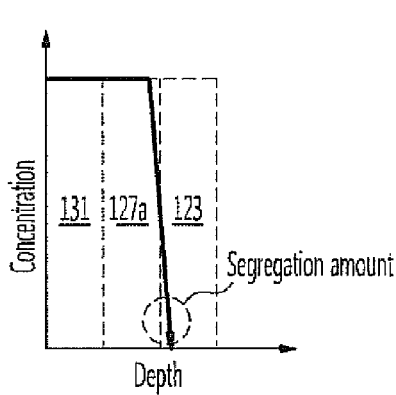
FIGS. 2A and 2B are graphs illustrating a diffusion control degree depending on existence of non-existence of a diffusion barrier layer.
Figure 2B:
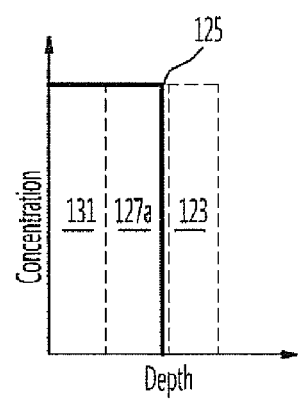

FIGS. 2A and 2B are graphs illustrating a diffusion control degree depending on existence of non-existence of a diffusion barrier layer.

Referring to FIG. 2A, when the diffusion barrier layer is not formed, the impurity from the conductive layer pattern 131 or the barrier metal pattern 127a is diffused to the charge blocking layer 123, thereby causing the deterioration of the characteristic of the charge blocking layer 123. For example, when Al within the barrier metal pattern 127a formed of TiAlN is diffused to the charge blocking layer 123, the charge blocking layer 123 may be changed to TiN and Al may be dispersed within the charge blocking layer 123.

Referring to FIG. 2B, when the diffusion barrier layer 125 is formed, the impurity from the conductive layer pattern 131 or the barrier metal pattern 127a is not nearly diffused to the charge blocking layer 123 under the diffusion barrier layer 125.

FIGS. 3A to 3G are cross-sectional views illustrating a method of manufacturing a 3D non-volatile memory device according to an exemplary embodiment of the present invention. Especially, FIGS. 3A to 3G are cross-sectional views illustrating a method of manufacturing the 3D non-volatile memory device illustrated in FIG. 1A.

Figure 3A:
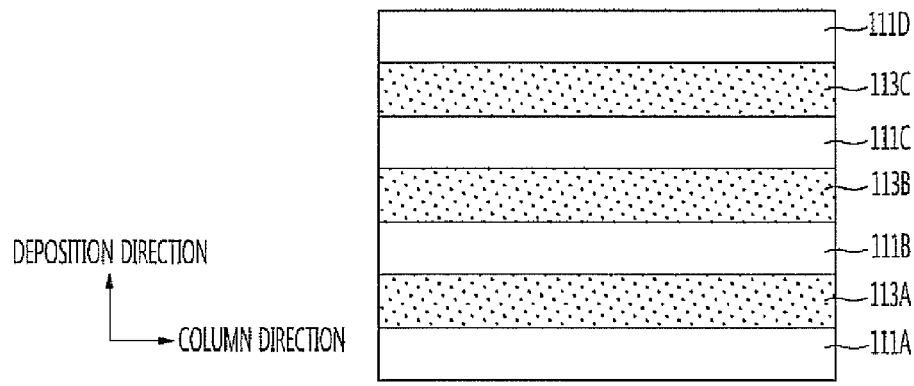

Referring to FIG. 3A, first material layers 111A to 111D and second material layers 113A to 113C are alternately deposited on a substrate including a lower structure (not shown). The substrate including the lower structure will be described later with reference to FIGS. 4A to 4D.

The first material layers 111A to 111D are material layers for interlayer insulation layers so as to insulate spaces of and separate conductive layer patterns to be subsequently formed, and may be formed of an oxide layer. The second material layers 113A to 113C are formed on layers on which word lines are to be formed, and may be formed of a material having a different etch selectivity from that of the first material layers 111A to 111D. The number of deposited layers of the first material layers 111A to 111D and the second material layers 113A to 113C is determined according to the number of memory cells to be deposited.

Figure 3B:
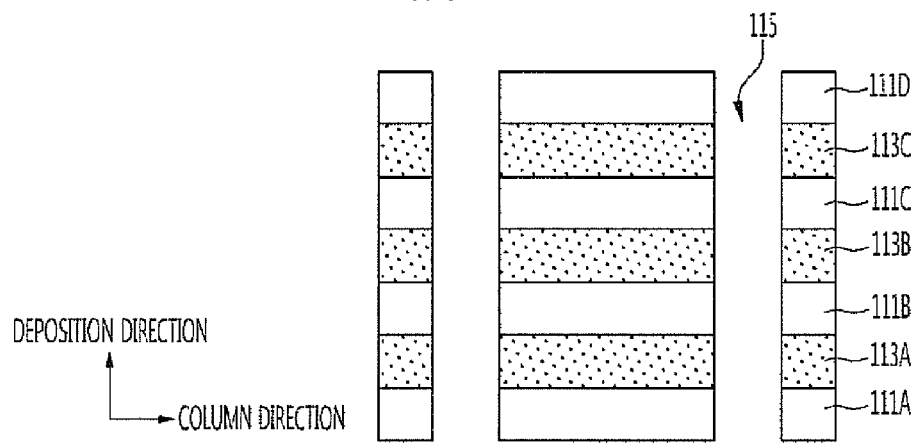

Referring to FIG. 3B, a plurality of channel holes 115 passing through the first material layers 111A to 111D and the second material layers 113A to 113C is formed by etching the first material layers 111A to 111D and the second material layers 113A to 113C.

Figure 3C:
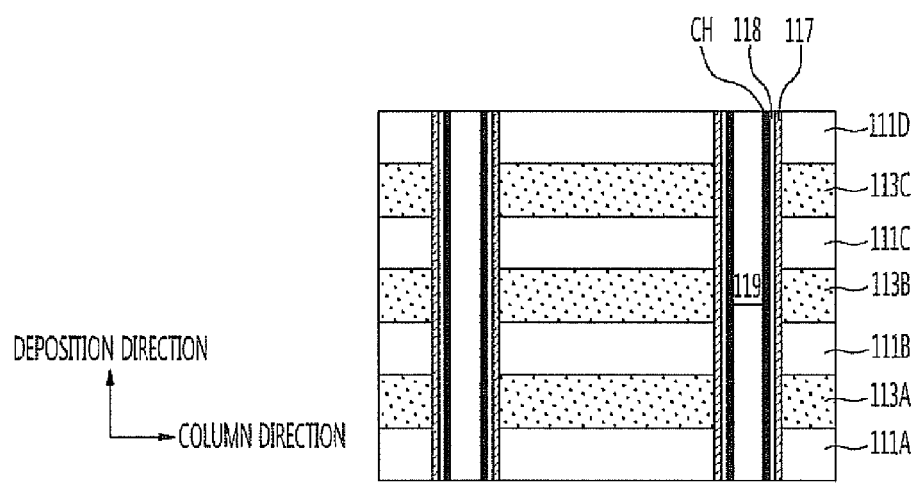

Referring to FIG. 3C, the charge storing layer 117 and the tunnel insulating layer 118 are sequentially formed on a surface of the channel hole 115. The charge storing layer 118 may be a nitride layer capable of charge trapping, and the tunnel insulating layer 118 may be formed of a silicon oxide layer.

Next, the vertical channel layer CH is formed on the tunnel insulating layer 118. The vertical channel layer CH may be formed of a semiconductor material. The vertical channel layer CH is formed in a shape of a pipe along the surface of the tunnel insulating layer 118 or is formed while filling an inside of the channel hole 115 in which the tunnel insulating layer 118 is formed. When the vertical channel layer CH is formed in the shape of the pipe, the inside of the pipe-shaped vertical channel layer CH may be filled with the insulating layer 119.

Referring to FIG. 3D, a slit 121 is formed by etching the first material layers 111A to 111D and the second material layers 113A to 113C. The slit 121 may be formed between adjacent vertical channel layers CH and expanded in one direction. Accordingly, side walls of the first material layers 111A to 111D and the second material layers 113A to 113C are exposed through the slit 121. The first material layers 111A to 111D and the second material layers 113A to 113C may be separated through the slit 121.

Referring to FIG. 3E, the second material layers 113A to 113C exposed through the slit 121 are removed by an etching process. Accordingly, the trenches T are formed between the adjacent first material layers 111A to 111D.

The first material layers 111A to 111D and the second material layers 113A to 113C are formed of the materials having different etch selectivity, so that only the second material layers 113A to 113C may be selectively etched according to an etching agent.

Referring to FIG. 3F, the charge blocking layer 123 is formed along a surface of an entire structure including the trenches T. The charge blocking layer 123 may be formed of the material described in FIG. 2. Thereafter, the diffusion barrier layer 125 is formed on the charge blocking layer 123. The diffusion barrier layer 125 may be formed through a plasma process using source gas containing the group 3 element or the group 5 element aforementioned with reference to FIG. 2. Subsequently, the barrier metal layer 127 is formed on the diffusion barrier layer 125. The barrier metal layer 127 may be formed of a material for the barrier metal pattern aforementioned with reference to FIG. 2. Next, the conductive layer 131 completely burying the insides of the trenches T is formed on the barrier metal layer 127. The conductive layer 131 may be formed of a material for the conductive layer pattern aforementioned with reference to FIG. 2.

Figure 3G:
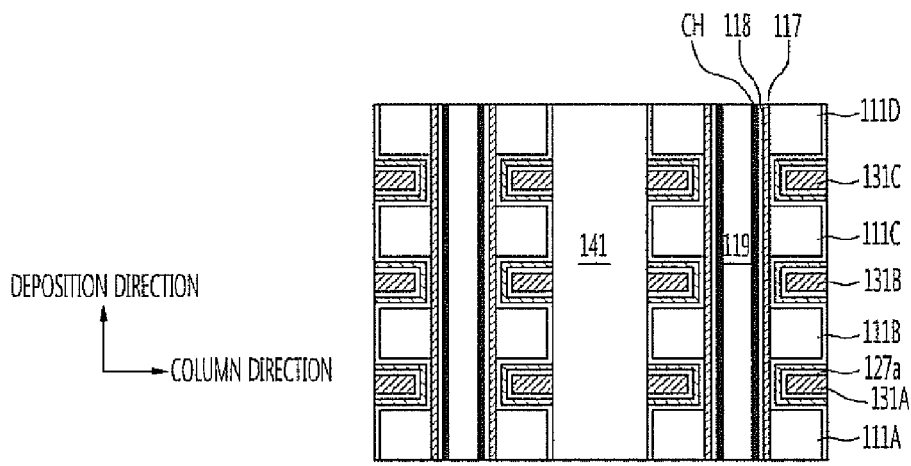

Referring to FIG. 3G, the conductive layer 131, the diffusion barrier layer 125, and the barrier metal layer 127 inside the slit 121 are etched in such a manner that the conductive layer 131, the diffusion barrier layer 125, and the barrier metal layer 127 formed in the insides of the trenches T are separated from each other. Accordingly, the conductive layer patterns 131A, 131B, and 131C, the barrier metal patterns 127a, and the diffusion barrier layer 125 are separated for each pattern. The conductive layer patterns 131A, 131B, and 131C, and the barrier metal patterns 127a may be used as the word lines. Then, the inside of the slit 121 is filled with the insulating layer 141.

Although it is not illustrated in the drawing, in order to form the 3D non-volatile memory device illustrated in FIG. 1B, the same processes as those described with reference to FIGS. 3A and 3B are performed, the charge blocking layer 123 is first formed on the surface of the channel hole 115 differently from the process described with reference to FIG. 3C, and then the charge storing layer 117, the tunnel insulating layer 118, and the vertical channel layer CH are sequentially formed. Then, the same processes as those described with reference to FIGS. 3D and 3E are performed and then the same subsequent processes as those described with reference to FIGS. 3F and 3G are performed, but the process of forming the charge blocking layer 123 described with reference to FIG. 3F is not performed.

Although it is not illustrated in the drawing, in order to form the 3D non-volatile memory device illustrated in FIG. 1C, the same processes as those described with reference to FIGS. 3A and 3B are performed, the diffusion barrier layer 125 that is the insulating layer is first formed on the surface of the channel hole 115 differently from the process described with reference to FIG. 3C, and then the charge blocking layer 123, the charge storing layer 117, the tunnel insulating layer 118, and the vertical channel layer CH are sequentially formed. Then, the same processes as those described with reference to FIGS. 3D and 3E are performed and subsequently the same subsequent processes as those described with reference to FIGS. 3F and 3G are performed. However, the process of forming the charge blocking layer 123 and the diffusion barrier layer 125 described with reference to FIG. 3F is not performed.

FIGS. 4A to 4D are cross-sectional views illustrating a 3D non-volatile memory device and a method of manufacturing the 3D non-volatile memory device according to another exemplary embodiment of the present invention.

Figure 4A:
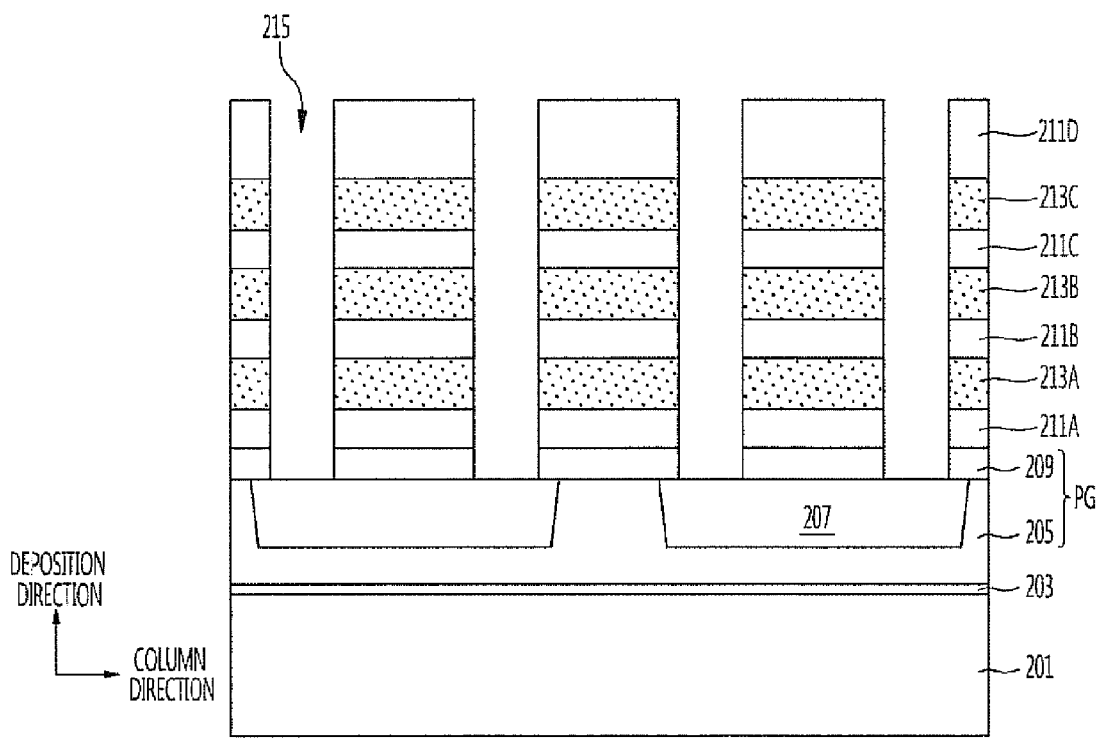
FIGS. 4A to 4D are cross-sectional views illustrating a 3D non-volatile memory device and a method of manufacturing the 3D non-volatile memory device according to another exemplary embodiment of the present invention.

Referring to FIG. 4A, the interlayer insulating layer 203 is formed on the substrate 201 and then a first pipe gate layer 205 is formed on the interlayer insulating layer 203. Then, the pipe trenches are formed within the first pipe gate layer 205 and an inside of each of the pipe trenches is filled with a sacrificial layer 207. Next, a second pipe gate layer 209 may be further formed on the first pipe gate layer 205 including the pipe trenches buried by the sacrificial layer 207. The second pipe gate layer 209 may be formed so as to enhance electric field applied to an inside of a pipe channel layer. The pipe gate layer PG including the first and second pipe gate layers 205 and 209 may be formed of the same material as that of the conductive layer pattern described with reference to FIG. 2.

Then, first material layers 211A to 211D and second material layers 213A to 213C are alternately deposited in the same manner as that described with reference to FIG. 3A on the lower structure including the pipe gate layer PG filled with the sacrificial layer 207. Next, a plurality of channel holes 215 are formed by etching the first material layers 211A to 211D and the second material layers 213A to 213C in the same manner as that described with reference to FIG. 3B. Both ends of the sacrificial layer 207 are exposed by a pair of channel holes 215.

Figure 4B:
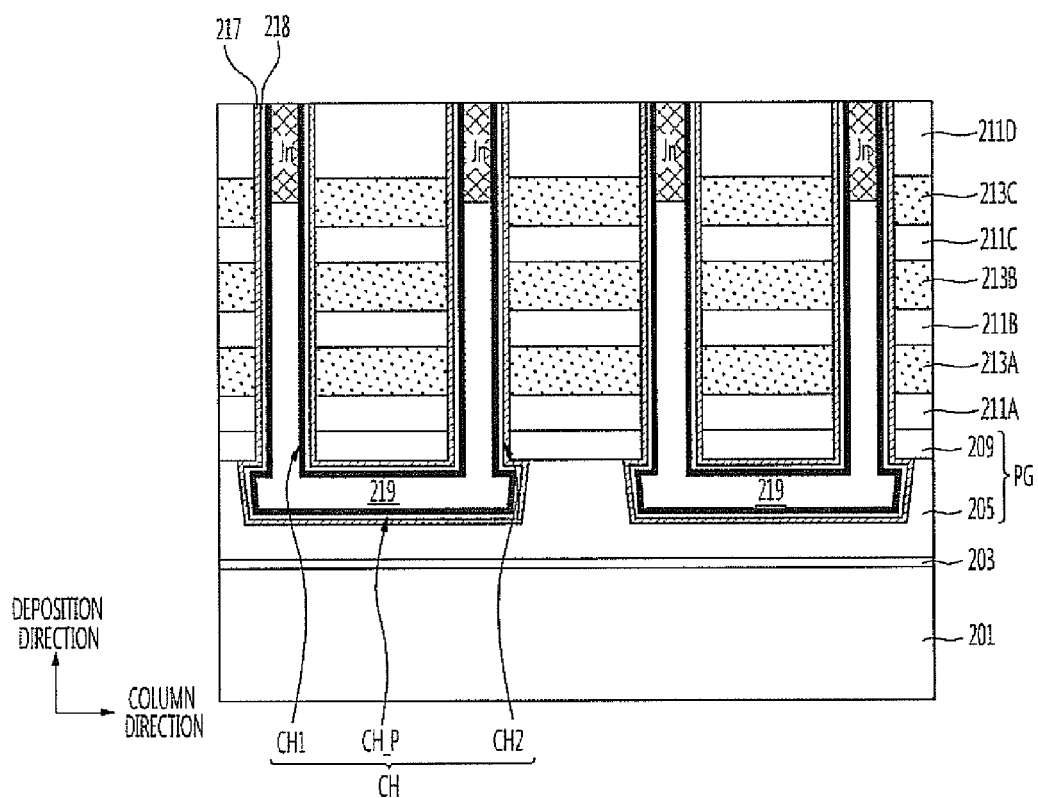

Referring to FIG. 4B, the sacrificial layer 207 exposed through the channel holes 215 is removed.

Accordingly, the pipe gate layer PG is exposed through the regions in which the sacrificial layer 207 is removed. Next, the charge storing layer 217 and the tunnel insulating layer 218 are formed of the same material as that described with reference to FIG. 3C along the surface of the region in which the channel hole 215 and the sacrificial layer 207 are removed. Then, a channel layer CH and an insulating layer 219 are formed of the same material as that described with reference to FIG. 3C. Next, an insulating layer 219 is partially removed, and a region in which the insulating layer 219 is removed is filled with a poly silicon layer, to form a junction region Jn.

The channel layer CH includes pipe channel layers CH_P formed in insides of the pipe trenches in which the sacrificial layer 207 is removed, and a pair of protruding first and second vertical channel layers CH1 and CH2 connected to both ends of each of the pipe channel layers CH_P. The first and second vertical channel layers CH1 and CH2 are alternately arranged for every two rows.

Figure 4C:
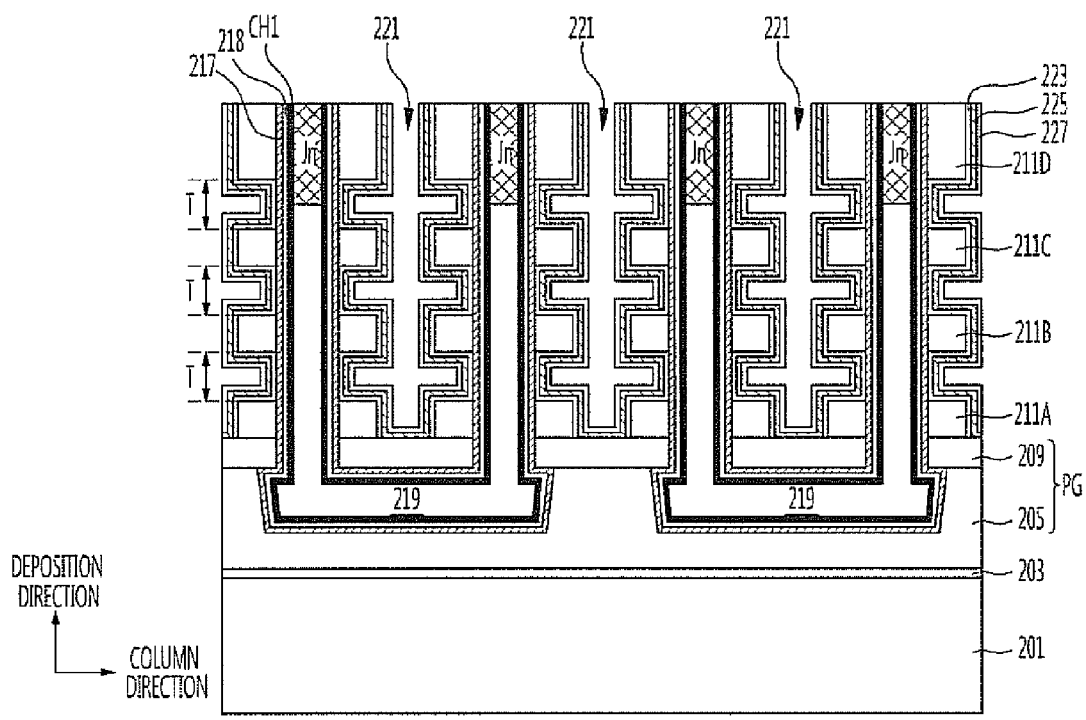

Referring to FIG. 4C, a slit 221 is formed through the same process as that described with reference to FIG. 3C. The slit 221 may be formed in every space between rows of the first vertical channel layers CH1 or in every space between rows of the second vertical channel layers CH2, or may be formed between the first and second vertical channel layers CH1 and CH2.

Next, the second material layers 213A to 213C exposed through the slit 221 are removed through the same process as that described with reference to FIG. 3E, to form the trenches T between the first material layers 211A to 211D.

Then, a charge blocking layer 223, a diffusion barrier layer 225, and a barrier metal layer 227 are sequentially formed through the same process as that described with reference to FIG. 3E.

Figure 4D:
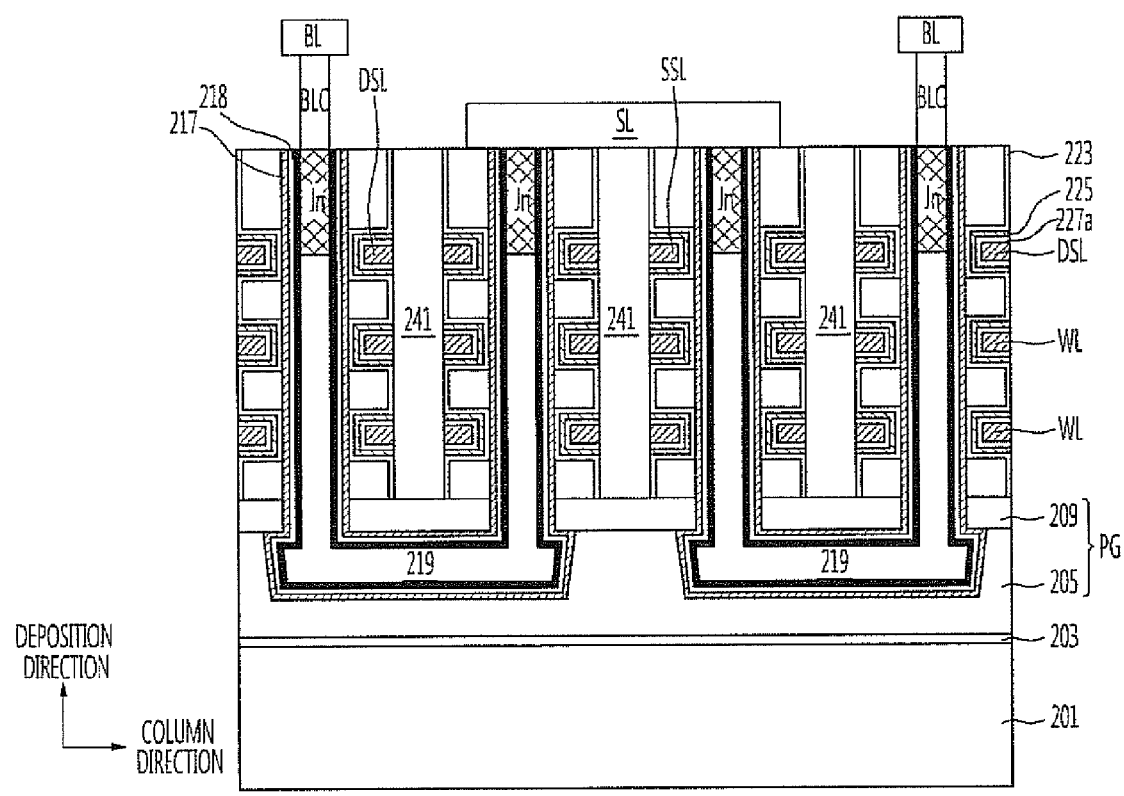

Referring to FIG. 4D, the insides of the trenches T are filled with a conductive layer through the same process as that described with reference to FIG. 3E. Then, the conductive layer, a barrier metal pattern 227a, and the diffusion barrier layer 225 separated for each word line WL or each select line DSL and SSL are formed in the inside of the trench T through the same process as that described with reference to FIG. 3G. Next, the inside of the slit 221 is filled with an insulating layer 241.

The drain select line DSL or the source select line may be formed in the inside of the trench T formed by removing the uppermost second material layer 213C among the second material layers 213A to 213C, and the word lines WL may be formed in the insides of the remaining trenches T.

Otherwise, the word lines WL may be formed in the insides of all trenches T formed by removing the second material layers 213A to 213C. In this case, the junction region 3n is not formed in the previous process. Further, the junction region Jn, the drain select line DSL, and the source select line SSL may be formed through a separated process after forming the insulating layer 241.

The drain select line DSL is formed so as to surround the first vertical channel layer CH1, and the source select line SSL is formed so as to surround the second vertical channel layer CH2. Depending on a case, the drain select line DSL may be formed so as to surround the first vertical channel layer CH1 in a first row or a second row, or the source select line SSL may be formed so as to surround the second vertical channel layer CH2 in a first row or a second row.

Next, a source line SL is formed on the junction region in connected to the second vertical channel layer CH2 and a bit line contact plug BLC is formed on the junction region in connected to the first vertical channel layer CH1. Then, the bit line BL is formed on the bit line contact plug BLC.

Through the aforementioned process, the memory cell transistors are defined in an intersection of the word lines WL and the vertical channel layers CH1 and CH2 as illustrated with reference to FIG. 2. Further, a drain select transistor is defined in an intersection of the drain select line DSL and the first vertical channel layer CH1, and a source select transistor is defined in an intersection of the source select line SSL and the second vertical channel layer CH2. In addition, a pipe transistor is defined in an intersection of the pipe gate layer PG and the pipe channel layer CH_P.

Figure 5:
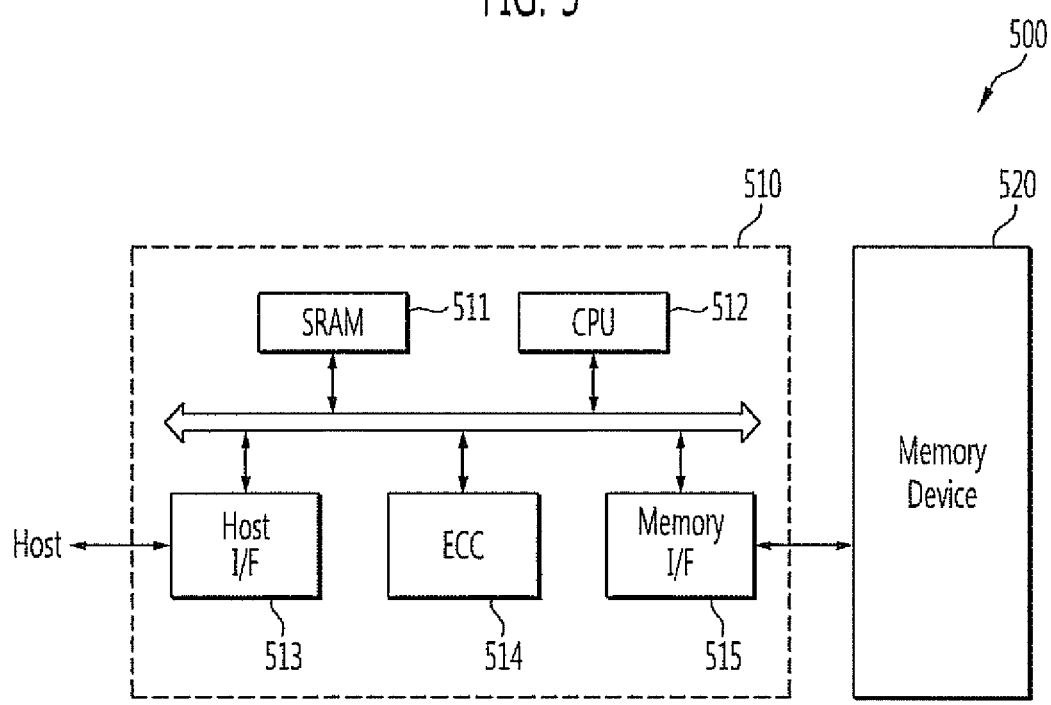
FIG. 5 is a block diagram schematically illustrating a memory system according to an exemplary embodiment of the present invention.

FIG. 5 is a block diagram schematically illustrating a memory system according to an exemplary embodiment of the present invention.

Referring to FIG. 5, a memory system 500 according to the exemplary embodiment of the present invention includes a memory device 520 and a memory controller 510.

The memory device 520 includes at least one of the 3D non-volatile memory devices aforementioned with reference to FIGS. 2 and 4D. That is, the memory device 520 includes vertical channel layers protruding from a substrate, interlayer insulating layers and conductive layer patterns alternately deposited along the vertical channel layers, barrier metal patterns surrounding the conductive layer patterns, a charge blocking layer interposed between the vertical channel layer and the barrier metal patterns; and a diffusion barrier layer interposed between the barrier metal patterns and the charge blocking layer.

The memory controller 510 controls data exchange between a host and the memory device 520. Further, the memory controller 510 may include an SRAM 511 used as an operational memory of a processing unit 512. In addition, the memory controller may further include a host interface 513 and a memory interface 515. The host interface 513 may include a protocol for data exchange between the memory system 500 and the host. The memory interface 515 may establish an access between the memory controller 510 and the memory device 520. Further, the memory controller 510 may further include an error correction block ECC 514. The error correction block 514 may detect and correct an error of data read from the memory device 520. Although it is not illustrated, the memory system 500 may further include a ROM device storing code data for interfacing with the host. The memory system 500 may be used as a portable data storing card. Otherwise, the memory system 500 may be implemented in a Solid State Disk (SSD) capable of substituting a hard disk of a computer system.

According to the exemplary embodiments of the present invention, the diffusion barrier layer is formed between the charge blocking layer and the barrier metal layer, so that diffusion of the impurity from the barrier metal layer to the charge blocking layer may be reduced.

From the foregoing, it will be appreciated that various embodiments of the present invention have been described herein for purposes of illustration, and that various modifications may be made without departing from the scope and spirit of the present invention. Accordingly, the various embodiments disclosed herein are not intended to be limiting, with the true scope and spirit being indicated by the following claims.

What is claimed is:

1. A 3-Dimensional (3D) non-volatile memory device comprising:
    vertical channel layers protruding from a substrate;
    interlayer insulating layers and conductive layer patterns alternately deposited along the vertical channel layers;
    barrier metal patterns surrounding the conductive layer patterns, respectively, wherein the barrier metal patterns include first impurities;
    a charge blocking layer interposed between the vertical channel layers and the barrier metal patterns; and
    a diffusion barrier layer interposed between the barrier metal patterns and the charge blocking layer, wherein the diffusion barrier layer includes second impurities having a different type from that of the first impurities to offset the first impurities from the barrier metal patterns.

2. The 3D non-volatile memory device of claim 1, wherein the barrier metal patterns comprise a group 3 element and the diffusion barrier layer comprises a group 5 element.

3. The 3D non-volatile memory device of claim 1, wherein the barrier metal patterns comprise a group 5 element and the diffusion barrier layer comprises a group 3 element.

4. The 3D non-volatile memory device of claim 1, wherein the barrier metal patterns comprise doped polysilicon, titanium aluminum nitride (TiAlN), or tantalum nitride (TaN).

5. The 3D non-volatile memory device of claim 1, wherein the conductive layer patterns include a material having lower resistance than polysilicon.

6. The 3D non-volatile memory device of claim 1, further comprising:
    a pipe gate formed between the interlayer insulating layers and the substrate; and
    a pipe channel layer formed in the pipe gate and coupling a pair of the vertical channel layers.

7. A memory system comprising:
    a 3D non-volatile memory device comprising:
        vertical channel layers protruding from a substrate,
        interlayer insulating layers and conductive layer patterns alternately deposited along the vertical channel layers,
        barrier metal patterns surrounding the conductive layer patterns, respectively, wherein the barrier metal patterns include first impurities,
        a charge blocking layer interposed between the vertical channel layers and the barrier metal patterns, and
        a diffusion barrier layer interposed between the barrier metal patterns and the charge blocking layer, wherein the diffusion barrier layer includes second impurities having a different type from that of the first impurities to offset the first impurities from the barrier metal patterns; and
    a memory controller configured to control the 3D non-volatile memory device.

* * * * *